United States Patent [19]

Nyul et al.

[11] 4,295,151
[45] Oct. 13, 1981

[54] METHOD OF BONDING TWO PARTS TOGETHER AND ARTICLE PRODUCED THEREBY

[75] Inventors: Paul Nyul, New Holland; Frederick R. Hughes, Lancaster, both of Pa.

[73] Assignee: RCA Corporation, New York, N.Y.

[21] Appl. No.: 111,814

[22] Filed: Jan. 14, 1980

[51] Int. Cl.³ .......................................... H01U 23/48
[52] U.S. Cl. ...................................... 357/68; 357/81; 357/17; 357/18
[58] Field of Search ...................... 357/81, 18, 17, 68

[56] References Cited

U.S. PATENT DOCUMENTS

| | | | |
|---|---|---|---|
| 2,817,048 | 12/1957 | Thuermel | 317/234 |
| 3,325,582 | 6/1967 | Ehrmann | 357/81 |
| 3,399,332 | 8/1968 | Savolainen | 357/81 |
| 3,480,842 | 11/1969 | Scharli | 317/234 |
| 4,124,864 | 11/1978 | Greenberg | 357/70 |

OTHER PUBLICATIONS

Dunkel, *IBM Tech. Discl. Bull.*, vol. 14, No. 11, Apr. 1972, p. 3332.

*Primary Examiner*—Martin H. Edlow
*Attorney, Agent, or Firm*—Birgit E. Morris; Donald S. Cohen

[57] ABSTRACT

An article having two parts bonded together includes an intermediate member between opposed surfaces of the two parts. The intermediate member has a plurality of openings therethrough which are filled with a bonding material. The opposed surfaces of the two parts engage opposed surfaces of the intermediate member and the bonding material is adhered to the opposed surfaces of the two parts to bond them together. The intermediate member provides control of the spacing between the two parts and the positional relationship of the two parts.

4 Claims, 3 Drawing Figures

METHOD OF BONDING TWO PARTS TOGETHER AND ARTICLE PRODUCED THEREBY

BACKGROUND OF THE INVENTION

The present invention relates to a method of bonding two parts together and the article produced thereby. In particular, the present invention relates to such a method which provides a controlled spacing between the parts to achieve dimensional control of the article.

In bonding two parts together it is often highly desirable to achieve accurate control of the spacing between the two parts and positional relationship, e.g. parallelism, between the parts. For example, in the semiconductor field two laser diodes are often secured together so as to provide an array which will emit two beams of light which are parallel and accurately spaced apart. When the parts are bonded together by a bonding medium which is fluid during the bonding operation, such as solder or the like, the control of the spacing and positional relationship is dependent on the flowability of the bonding medium. The flowability of the bonding medium is dependent on a number of factors, such as temperature, pressure, and viscosity of the bonding medium, so that the control is not easy to achieve.

SUMMARY OF THE INVENTION

Two parts are bonded together to form an article by placing between opposed surfaces of the parts a bonding medium and an intermediate member. The intermediate member has spaced, substantially parallel surfaces and a plurality of openings therethrough between the surfaces. The parts are pressed together against the bonding medium and the intermediate member causing the bonding medium to flow into the openings in the intermediate member so that the bonding medium contacts and bonds together the opposed surfaces of the two parts. The parts are pressed together until they contact the spaced surfaces of the intermediate member thereby achieving controlled spacing between the two parts.

DETAILED DESCRIPTION OF THE INVENTION

Figure 1:
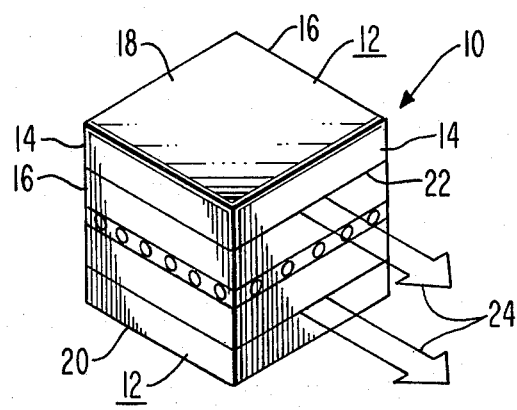
FIG. 1 is a perspective view of a form of an article incorporating the present invention, the article being an array of two laser diodes bonded together.
Figure 2:
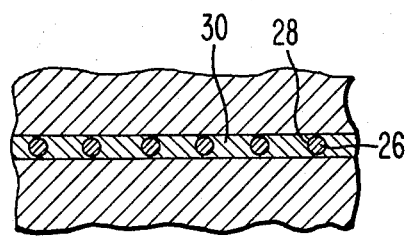
FIG. 2 is a sectional view across a portion of the article shown in FIG. 1.

Referring to FIG. 1, there is shown one form of an article, generally designated as 10, which incorporates the present invention. The article 10 is an array of two laser diodes 12 which are bonded together. Each of the laser diodes 12 may be of any well known construction, such as that shown and described in U.S. Pat. No. 4,092,659 to M. Ettenberg, issued May 30, 1978 entitled "MULTI-LAYER REFLECTOR FOR ELECTROLUMINESCENT DEVICE". However, in general, each of the laser diodes 12 is a body of semiconductor material in the form of a rectangular parallelepiped having spaced, parallel end surfaces 14, spaced side surfaces 16, and top and bottom surfaces 18 and 20, respectively. The body includes regions of opposite conductivity type forming a PN junction 22 which extends to the end surfaces 14. In the operation of the laser diodes 12, light is generated in the body adjacent the PN junction 22 and is emitted from one of the end surfaces 14 as indicated by the arrows 24. The top and bottom surfaces 18 and 20 may be coated with a conductive metal contact to permit ease of making electrical connections to the diode.

In the article 10, which is the laser diode array, the bottom surface 20 of one of the laser diodes 12 is in spaced, opposed relation to the top surface 18 of the other laser diode 12. Between the opposed surfaces 18 and 20 of the laser diodes 12 is an intermediate member 26. The intermediate member 26 has spaced, opposed surfaces and a plurality of openings 28 therethrough between the opposed surfaces. For making the laser diode array 10, the intermediate member 26 is preferably of a conductive metal. The opposed top and bottom surfaces 18 and 20 of the laser diodes 12 each contact a separate one of the opposed surfaces of the intermediate member 26. A bonding medium 30, such as a conductive solder, fills the openings 28 in the intermediate member 26 and is adhered to the opposed top and bottom surfaces 18 and 20 of the laser diodes 12 to secure the two laser diodes 12 together.

Figure 3:
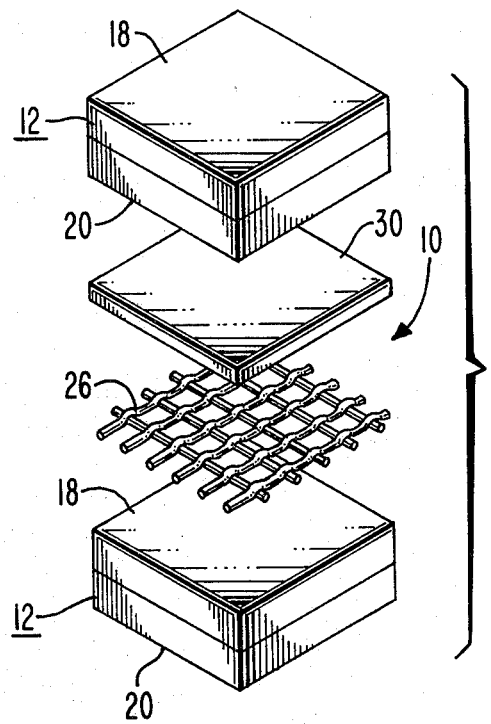
FIG. 3 is an exploded perspective view illustrating the initial step of carrying out the method of the present invention.

Referring to FIG. 3, the laser diode array 10 is made by placing between the bottom surface 20 of one laser diode 12 and the top surface 18 of the other laser diode 12, an intermediate member 26 and a preform of the bonding material 30. The laser diodes 12 are pressed together against the intermediate member 26 and the bonding material preform 30. The assembly is heated to cause the bonding material 30 to melt and flow into the openings 28 in the intermediate member 26. The two diodes are pressed together until they contact the opposed sides of the intermediate member 26. The array 10 is then cooled to cause the bonding material 30 to adhere and bond the two diodes 12 together.

In the article 10 of the present invention the spacing between the two laser diodes 12 is controlled by the thickness of the intermediate member 26. Since the two laser diodes 12 are pressed together until they contact the intermediate member 26, very accurate control of the spacing is easily achieved. Proper orientation between the two laser diodes 12 is achieved by controlling the surface configuration of both the laser diodes 12 and the intermediate member 26. Thus, emission of parallel beams of light from the laser diode array 10 can be easily achieved by forming the laser diodes with parallel top and bottom surfaces and the intermediate member 26 with parallel opposed surfaces.

The intermediate member 26 can be of any structure that will provide opposed surfaces having the desired configuration and openings through the intermediate member. As shown, the intermediate member can be of a mesh-like configuration. Alternatively, the intermediate member can be a sheet having holes therethrough. Although for a laser diode array it is desirable that the intermediate member 26 be of an electrically conductive material, the intermediate member can be of any desired material having sufficient rigidity to provide the control of the spacing between the two parts being bonded together. Although the bonding material 30 has been shown and described as being a separate preform inserted between one of the laser diodes 12 and the intermediate member 26, the bonding material may be a layer pre-coated on one or both of the opposing surfaces of the laser diodes 12 or on the intermediate member 26.

We claim:

1. An array of laser diodes comprising
a pair of laser diodes each being a body of semiconductor material having top and bottom surfaces and an edge surface from which light is adapted to be emitted, said diodes being arranged with the top surface of one being in spaced opposed relation to the bottom surface of the other,
an intermediate member between said opposed surfaces of the laser diodes and having a separate surface contacting each of said opposed surfaces of said laser diodes, said intermediate member having a plurality of openings therethrough, and
a bonding material in the openings in the intermediate member and adhered to the opposed surfaces of said diodes to secure the diodes together.

2. An array in accordance with claim 1 in which the intermediate member is of an electrically conductive material.

3. An array in accordance with claim 2 in which the bonding material is of an electrically conductive material to electrically and mechanically connect said laser diodes.

4. An array in accordance with claim 3 in which each of said laser diodes is a body in the form of a parallelepiped having regions of opposite conductivity type forming a PN junction therebetween which extends to a light emitting edge of the body and the top and bottom surfaces of the diodes are substantially parallel to said PN junction.

* * * * *